United States Patent
Li et al.

(10) Patent No.: US 10,496,303 B2
(45) Date of Patent: Dec. 3, 2019

(54) METHOD FOR REDUCING POWER CONSUMPTION MEMORY, AND COMPUTER DEVICE

(71) Applicant: Huawei Technologies Co., Ltd., Shenzhen (CN)

(72) Inventors: Zhibing Li, Chengdu (CN); Yongjiang Yi, Madrid (ES)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 288 days.

(21) Appl. No.: 15/481,602

(22) Filed: Apr. 7, 2017

(65) Prior Publication Data
US 2017/0212704 A1 Jul. 27, 2017

Related U.S. Application Data

(63) Continuation of application No. PCT/CN2015/099989, filed on Dec. 30, 2015.

(51) Int. Cl.
G06F 3/06 (2006.01)
G06F 1/30 (2006.01)
(Continued)

(52) U.S. Cl.
CPC ............ G06F 3/0625 (2013.01); G06F 1/305 (2013.01); G06F 1/3225 (2013.01);
(Continued)

(58) Field of Classification Search
CPC .......... G06F 3/0625; G06F 1/30; G06F 1/305; G06F 1/3225; G06F 1/3275;
(Continued)

(56) References Cited

U.S. PATENT DOCUMENTS

2004/0190210 A1 9/2004 Leete
2005/0278486 A1 12/2005 Trika et al.
(Continued)

FOREIGN PATENT DOCUMENTS

CN 101034306 A 9/2007
CN 101099135 A 1/2008
(Continued)

OTHER PUBLICATIONS

Machine Translation and Abstract of Chinese Publication No. CN101034306, dated Sep. 12, 2007, 10 pages.
(Continued)

*Primary Examiner* — David Yi
*Assistant Examiner* — Nicholas A. Paperno
(74) *Attorney, Agent, or Firm* — Conley Rose, P.C.

(57) ABSTRACT

A method for reducing power consumption of a memory of a computer device is presented. The memory includes at least two channels, each channel includes at least two storage units, a dirty data storage area is set in the memory, and the dirty data storage area includes at least one storage unit in each channel. After the computer device encounters a power failure, a backup power supply is turned on to supply power to the memory, then the storage unit included in the dirty data storage area is kept in a normal operating state, and a storage unit outside the dirty data storage area in the memory is caused to enter a self-refreshing state. Data in the dirty data storage area is then written to a non-volatile storage area of the computer device.

20 Claims, 4 Drawing Sheets

(51) Int. Cl.
*G06F 1/3225* (2019.01)
*G06F 9/4401* (2018.01)
(52) U.S. Cl.
CPC .......... *G06F 3/0655* (2013.01); *G06F 3/0679* (2013.01); *G06F 9/4411* (2013.01); *Y02D 10/13* (2018.01); *Y02D 10/14* (2018.01)
(58) Field of Classification Search
CPC .... G06F 3/0655; G06F 3/0679; G06F 9/4411; G11C 5/141; G11C 14/0009
See application file for complete search history.

(56) References Cited

U.S. PATENT DOCUMENTS

| | | |
|---|---|---|
| 2006/0136765 A1 | 6/2006 | Poisner et al. |
| 2010/0205348 A1* | 8/2010 | Moshayedi ............... G11C 5/14 711/102 |
| 2010/0274980 A1 | 10/2010 | Stringham |
| 2011/0016260 A1 | 1/2011 | Lomelino et al. |
| 2011/0016270 A1* | 1/2011 | Yeh ....................... G06F 9/4401 711/105 |
| 2011/0219248 A1 | 9/2011 | Cho et al. |
| 2012/0017033 A1 | 1/2012 | Moritoki |
| 2013/0132662 A1 | 5/2013 | Muroyama et al. |
| 2014/0189230 A1 | 7/2014 | Wang et al. |
| 2015/0287461 A1 | 10/2015 | Song |
| 2016/0300611 A1 | 10/2016 | Song |

FOREIGN PATENT DOCUMENTS

| | | |
|---|---|---|
| CN | 102460401 A | 5/2012 |
| CN | 102725752 A | 10/2012 |
| CN | 103003804 A | 3/2013 |
| CN | 104122977 A | 10/2014 |
| CN | 104331145 A | 2/2015 |
| CN | 104978993 A | 10/2015 |
| TW | 201426304 A | 7/2014 |

OTHER PUBLICATIONS

Machine Translation and Abstract of Chinese Publication No. CN102725752, dated Oct. 10, 2012, 11 pages.
Machine Translation and Abstract of Chinese Publication No. CN104122977, dated Oct. 29, 2014, 11 pages.
Machine Translation and Abstract of Chinese Publication No. CN104331145, dated Feb. 4, 2015, 8 pages.
Foreign Communication From a Counterpart Application, PCT Application No. PCT/CN2015/099989, English Translation of International Search Report dated Sep. 27, 2016, 3 pages.
Foreign Communication From a Counterpart Application, European Application No. 15902472.8, European Office Action dated Aug. 7, 2018, 9 pages.
Foreign Communication From a Counterpart Application, European Application No. 15902472.8, Extended European Search Report dated Oct. 10, 2017, 9 pages.

* cited by examiner

FIG. 7

METHOD FOR REDUCING POWER CONSUMPTION MEMORY, AND COMPUTER DEVICE

CROSS-REFERENCE TO RELATED APPLICATIONS

This application is a continuation of International Application No. PCT/CN2015/099989, filed on Dec. 30, 2015, the disclosure of which is hereby incorporated by reference in its entirety.

TECHNICAL FIELD

The present disclosure relates to the field of data storage technologies, and in particular, to a method for reducing power consumption of a memory, and a computer device.

BACKGROUND

When a computer device encounters a power failure suddenly, to prevent data loss in a memory, a power backup function needs to be enabled to write data in the memory to a hard disk.

Generally, data stored in a memory includes dirty data and common data. The dirty data is data that is newly written or data that is modified. The common data is data that is read from a hard disk and that is not modified. When data backup is performed, generally, only the dirty data needs to be backed up. However, because the dirty data is randomly written to different locations in the memory when data is written, power needs to be globally supplied to the memory after the computer device encounters a fault or a power failure, until the data in the memory is completely written to the hard disk.

However, the memory is an element that consumes a relatively large amount of power, and therefore consumes a relatively large amount of electric energy of a backup power supply.

In addition, during normal operation, the computer device may perform only one operation such as a read operation or a write operation for a long period of time. However, even if only a single operation is performed, the entire memory needs to be in a normal power supply state, and therefore consumes a relatively large amount of power.

SUMMARY

This application provides a method for reducing power consumption of a memory, and a computer device, so as to reduce power consumption of a memory.

According to a first aspect of embodiments of the present disclosure, a method for reducing power consumption of a memory is provided, applied in a computer device. The memory includes at least two channels, each channel includes at least two storage units, a dirty data storage area is set in the memory, and the dirty data storage area includes at least one storage unit in each channel. The method includes, when a data operation request is received, determining whether data to be operated in the data operation request is dirty data; storing, when it is determined that the data to be operated in the data operation request is dirty data, the dirty data in the dirty data storage area; after the computer device encounters a power failure, turning on a backup power supply to supply power to the memory; causing the storage unit included in the dirty data storage area to enter a normal operating state, and causing a storage unit outside the dirty data storage area in the memory to enter a self-refreshing state; and writing data in the dirty data storage area to a non-volatile storage area of the computer device.

Preferably, the method further includes receiving setting information of the memory, where the setting information of the memory is stored in a basic input/output system (BIOS) memory of the computer device, so that when the computer device is started, the computer device obtains the setting information from the BIOS memory, and sets the dirty data storage area.

Preferably, the writing data in the dirty data storage area to a non-volatile storage area of the computer device includes causing a storage unit that is in the dirty data storage area and that is currently operated to enter an operating state; causing a storage unit that is in the dirty data storage area and that is not currently operated to enter a self-refreshing state; and when data in the storage unit that is currently operated is completely written to a non-volatile memory, causing the storage unit that is currently operated to enter a self-refreshing state, and selecting one of storage units that are still not operated as a currently operated storage unit until the data in the dirty data storage area is completely written to the non-volatile memory.

Preferably, the storing, when it is determined that the data to be operated in the data operation request is dirty data, the dirty data in the dirty data storage area includes reading to-be-rewritten data from the memory first when the data operation request is a data rewriting request; storing the to-be-rewritten data in the dirty data storage area; and rewriting the to-be-rewritten data, and invalidating the to-be-rewritten data.

Preferably, the storage unit is a rank.

According to a second aspect of the embodiments of the present disclosure, a method for reducing power consumption of a memory is provided, where the memory includes at least two channels, each channel includes at least two storage units, at least two storage areas are set in the memory, each storage area includes at least one storage unit in each channel and stores one type of data, and the method includes, when a data operation request is received, determining a type of data to be operated in the data operation request; determining, according to the type of the data to be operated in the data operation request, a storage area corresponding to the data to be operated; causing the storage area corresponding to the data to be operated to enter an operating state; and causing another storage area in the memory to enter a self-refreshing state.

Preferably, the method further includes receiving setting information of the memory, where the setting information of the memory is stored in a BIOS memory of the computer device, so that when the computer device is started, the computer device obtains the setting information from the BIOS memory, and sets the at least two storage areas.

Preferably, the storage unit is a rank.

According to a third aspect of the embodiments of the present disclosure, a computer device is provided, where the memory of the computer device includes at least two channels, each channel includes two storage units, a dirty data storage area is set in the memory, the dirty data storage area includes at least one storage unit in each channel, and the computer device includes a determining module configured to, when a data operation request is received, determine whether data to be operated in the data operation request is dirty data; a storage module configured to, when it is determined that the data to be operated in the data operation request is dirty data, store the dirty data in the dirty data storage area; and a backup power module configured to, after the computer device encounters a power failure, turn on a backup power supply to supply power to the memory; and cause the storage unit included in the dirty data storage area to enter a normal operating state, cause a storage unit outside the dirty data storage area in the memory to enter a self-refreshing state, and write data in the dirty data storage area to a non-volatile storage area.

Preferably, the computer device further includes a setting module, where the setting module is configured to receive setting information of the memory, where the setting information of the memory is stored in a BIOS memory of the computer device, so that when the computer device is started, the computer device obtains the setting information from the BIOS memory, and sets the dirty data storage area.

Preferably, the backup power module is configured to cause a storage unit that is in the dirty data storage area and that is currently operated to enter an operating state; cause a storage unit that is in the dirty data storage area and that is not currently operated to enter a self-refreshing state; and when data in the storage unit that is currently operated is completely written to a non-volatile memory, cause the storage unit that is currently operated to enter a self-refreshing state, and select one of storage units that are still not operated as a currently operated storage unit until the data in the dirty data storage area is completely written to the non-volatile memory.

Preferably, the storage module is configured to, when the data operation request is a data rewriting request, read to-be-rewritten data from the memory first; store the to-be-rewritten data in the dirty data storage area; and rewrite the to-be-rewritten data, and invalidate the to-be-rewritten data.

Preferably, the storage unit is a rank.

According to a fourth aspect of embodiments of the present disclosure, a computer device is provided, where a memory of the computer device includes at least two channels, each channel includes at least two storage units, at least two storage areas are set in the memory, each storage area includes at least one storage unit in each channel and stores one type of data, and the method includes a determining module configured to, when a data operation request is received, determine a type of data to be operated in the data operation request, and determine, according to the type of the data to be operated in the data operation request, a storage area corresponding to the data to be operated; and a power saving module configured to cause the storage area corresponding to the data to be operated to enter an operating state, and cause another storage area in the memory to enter a self-refreshing state.

Preferably, the computer device further includes a setting module configured to receive setting information of the memory, where the setting information of the memory is stored in a BIOS memory of the computer device, so that when the computer device is started, the computer device obtains the setting information from the BIOS memory, and sets the at least two storage areas.

During operation of a computer device, dirty data is stored in a dirty data storage area that is obtained by means of division in advance, and the dirty data storage area includes a storage unit in each channel of a memory. In this case, when efficiency of accessing data during operation of the computer device is not affected, after the computer device encounters a power failure, only the dirty data storage area is caused to enter a normal operating state, and a storage unit in a common data storage area is caused to enter a self-refreshing state. Because the storage unit consumes little electric energy in a self-refreshing state, electric energy consumed when a backup power supply supplies power to the memory is effectively reduced.

In addition, during operation of the computer device, a type of data to be operated is determined, an operation area corresponding to the type of the data to be operated in a memory is determined according to the type of the data to be operated, a current operation area in the memory is set to an operating state, but storage units in areas except the current operation area are all caused to enter a self-refreshing state. In this way, electric energy consumed by the memory during operation of the computer device can be effectively reduced.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of common skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of common skill in the art based on the embodiments of the present disclosure without creative efforts shall fall within the protection scope of the present disclosure.

Figure 1:
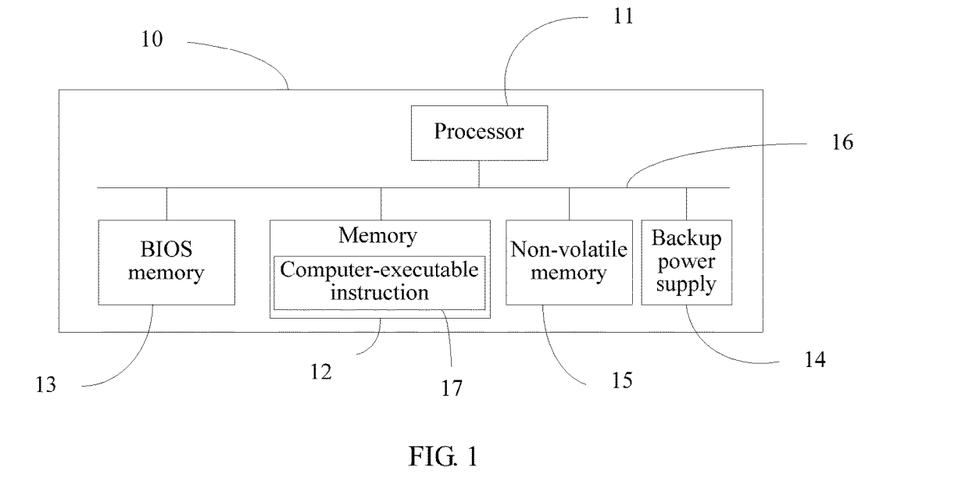
FIG. 1 is a structural diagram of a computer device according to an embodiment of the present disclosure.

As shown in FIG. 1, FIG. 1 is a structural diagram of a computer device 10 applied in an embodiment of the present disclosure.

The computer device 10 may include a processor 11, a memory 12, a BIOS memory 13, a backup power supply 14, a non-volatile memory 15, and a system bus 16. The processor 11, the memory 12, the BIOS memory 13, the backup power supply 14, and the non-volatile memory 15 communicate with each other using the system bus 16.

The processor 11 may be a single-core or multi-core central processing unit, an application-specific integrated circuit, or one or more integrated circuits that are configured to implement this embodiment of the present disclosure.

The memory 12 may be a high-speed random access memory (RAM) configured to store a computer-executable instruction 17. The computer-executable instruction 17 may include program code.

Figure 3:
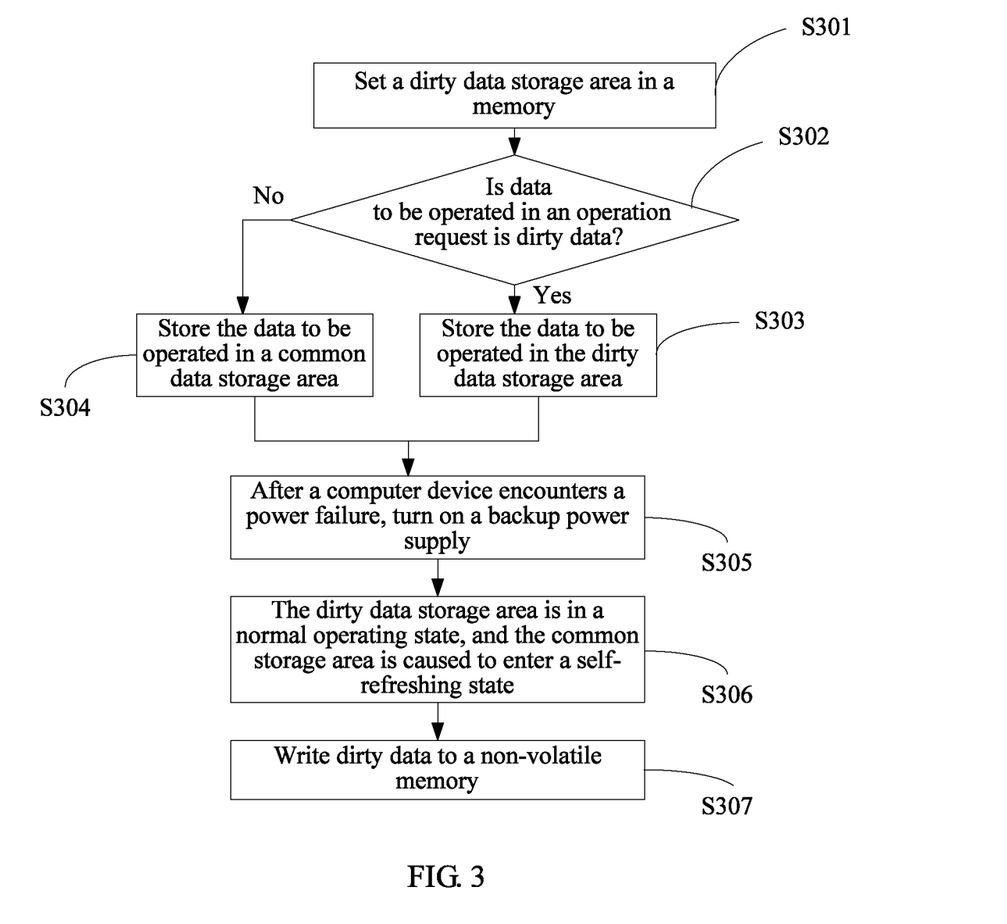
FIG. 3 is a flowchart of a method for saving power of the memory in the first application scenario.
Figure 4:
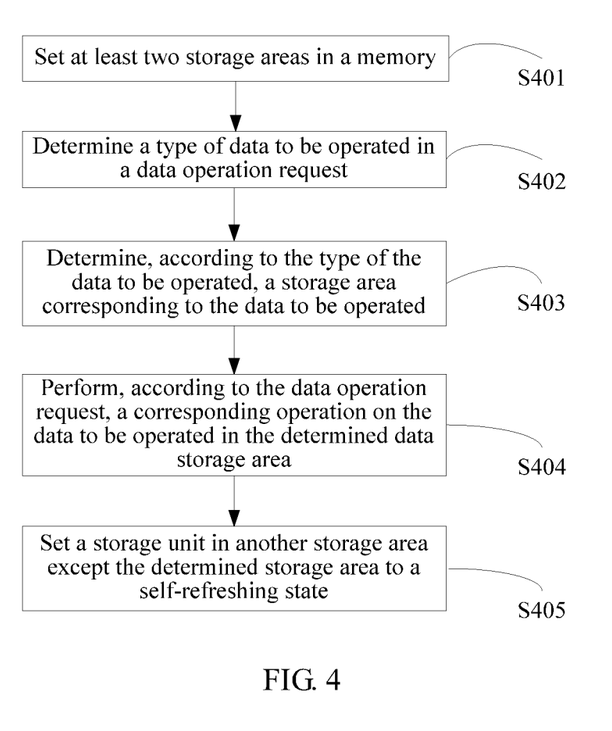
FIG. 4 is a structural diagram of the memory in the computer device shown in FIG. 1 in a second application scenario.

During operation of the computer device 10, the processor 11 executes the computer-executable instruction 17 to perform the method shown in FIG. 3 or FIG. 4.

The memory 12 includes a memory controller 124 and at least two channels, where each channel includes at least two storage units 123. In this way, the memory controller can store data in the storage units 123 using multiple channels and improve data access efficiency. In this embodiment, the storage unit 123 is a rank. However, in another embodiment, the storage unit 123 may be a bank. The at least two ranks may be included in a Dual-Inline-Memory-Modules (DIMM, not shown), or may be included in multiple DIMMs.

Setting information of the memory 12 and another element is stored in the BIOS memory 13. When the processor 11 executes a boot program that is burned in the BIOS memory 13, a memory setting interface may be provided, so that a user can set a memory parameter.

The backup power supply 14 is configured to, after the computer device encounters a power failure, supply power to the memory and another element that needs power supply. Data in the memory 12 has been written to the non-volatile memory 15. The backup power supply 14 may be a battery or a capacitor.

The non-volatile memory 15 may be a hard disk, or may be a part of the memory.

Based on a structure of the foregoing computer device, this embodiment of the present disclosure may be applied in two scenarios. In a first application scenario, after the computer device 10 encounters a power failure, when a power backup function of the computer device 10 is used to write data in the memory 12 to the non-volatile memory 15, electric energy consumed by the memory 12 is reduced. In another scenario, during operation of the computer device 10, electric energy consumed by the memory 12 is reduced.

First, in the first application scenario, that is, after the computer device 10 encounters a power failure, when a power backup function of the computer device 10 is used to write data in the memory 12 to the non-volatile memory 15, the method for reducing electric energy consumed by the memory 12 includes the following steps.

Step S301: Set a dirty data storage area in the memory.

The dirty data storage area includes at least one storage unit in each channel. In an example in which a storage unit is a rank, a rank 0 to a rank 3 may be set as a dirty data storage area.

In this embodiment of the present disclosure, two methods for setting a dirty data storage area are provided. In one setting method, when the processor 11 executes a BIOS boot program stored in the BIOS memory 13 to set a memory parameter, set the dirty data storage area, and the setting information is stored in the BIOS memory 13.

In the other setting method, the processor 11 performs setting after a system is started. Because address space of the memory and address space of each rank are stored in a memory configuration file, ranks included in the dirty data storage area may be set according to the address space of each rank.

Figure 2:
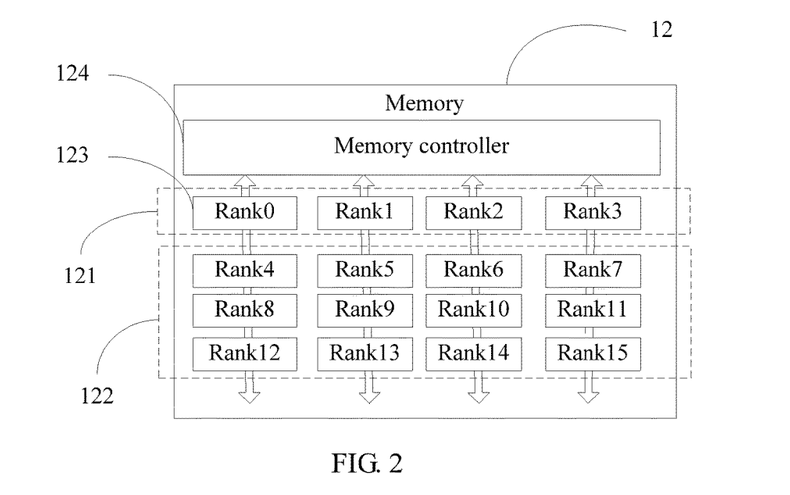
FIG. 2 is a structural diagram of a memory of the computer device shown in FIG. 1 in a first application scenario.

The processor 11 may obtain the setting information, and set a dirty data storage area 121 in the memory 12 according to the setting information. In this case, the dirty data storage area 121 and a common data storage area 122 are set in the memory. As shown in FIG. 2, the rank 0 to the rank 3 are set as a dirty data storage area, and other ranks are set as a common data storage area.

Step S302: When a data operation request is received, the processor 11 determines whether data to be operated in the data operation request comprises dirty data.

Step S303: When it is determined that the data to be operated in the data operation request comprises dirty data, store the data to be operated in the dirty data storage area 121.

Step S304: When it is determined that the data to be operated in the data operation request does not comprises dirty data, store the data to be operated in the common data storage area 122.

The dirty data may be to-be-written data in an input/output (IO) write request delivered by the processor, writing data in a rewriting request, metadata, or system critical data, for example, system dirty data, generated in an operation process of an operating system.

Data that is not dirty data, that is, common data, may be read data that is written from a hard disk to the memory and other noncritical data.

It should be noted that when the data operation request is a rewriting request, to-be-rewritten data is read from the common data storage area first, the to-be-rewritten data is stored in the dirty data storage area, the to-be-rewritten data is then rewritten, and the to-be-rewritten data in the common data storage area is invalidated.

Step S305: After the computer device 10 encounters a power failure, turn on the backup power supply 14 to supply power to the memory 12.

Step S306: Cause the storage units 123 included in the dirty data storage area 121 to enter a normal operating state; and cause the storage units 123 in the common data storage area 122 to enter a self-refreshing state.

Step S307: Write dirty data stored in the dirty data storage area 121 to the non-volatile memory 15.

In this case, during operation of a computer device, dirty data is stored in a dirty data storage area that is obtained by means of division in advance, and the dirty data storage area includes a storage unit in each channel of the memory. In this way, when efficiency of accessing data during operation of the computer device is not affected, after the computer device encounters a power failure, only the dirty data storage area is caused to enter a normal operating state, and a storage unit in a common data storage area is caused to enter a self-refreshing state. Because the storage unit consumes little electric energy in a self-refreshing state, electric energy consumed when a backup power supply supplies power to the memory is effectively reduced.

When data in the dirty data storage area 121 is written to the non-volatile memory 15, the storage unit 123 that is in the dirty data storage area 121 and that is currently operated is caused to enter an operating state, and the storage unit 123 that is in the dirty data storage area 121 and that is not currently operated is caused to enter a self-refreshing state. When data in the storage unit 123 that is currently operated is completely written to the non-volatile memory 15, the storage unit 123 that is currently operated is caused to enter a self-refreshing state, and one of storage units 123 that are still not operated is selected as a currently operated storage unit 123 until the dirty data in the dirty data storage area 121 is completely written to the non-volatile memory 15.

For example, as shown in FIG. 2, the dirty data storage area includes four ranks, that is, a rank 0 to a rank 3. When dirty data in the rank 0 is stored in the non-volatile memory 15, the rank 1 to the rank 3 are caused to enter a self-refreshing state. However, after the dirty data in the rank 0 is completely stored, the rank 0 is set to a self-refreshing state, and the rank 2 is enabled. Such a process is repeated.

After data in all ranks in the dirty data storage area 121 is written to the non-volatile memory 15, the backup power supply may be turned off.

In this way, electric energy consumed by writing data in the memory 12 to the non-volatile memory 15 can be further reduced.

Figure 5:
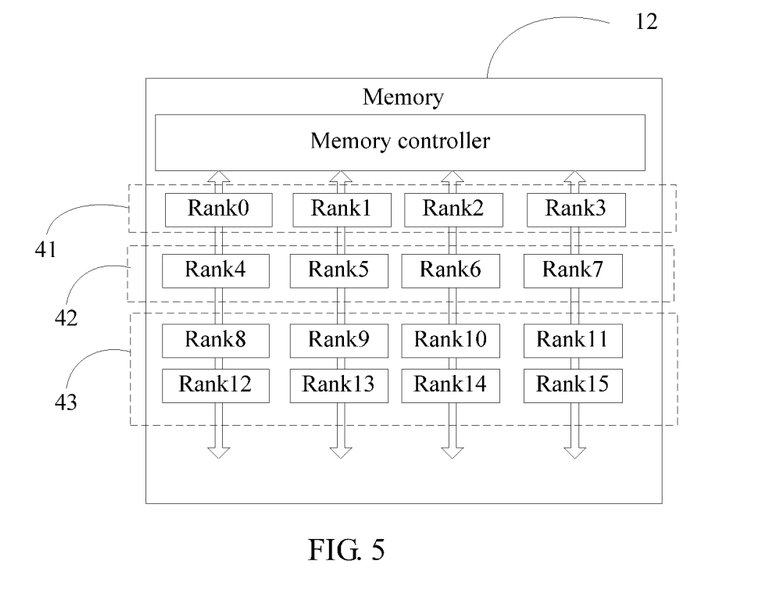
FIG. 5 is a flowchart of a method for saving power of the memory in the second application scenario.

In the second application scenario, during operation of the computer device, the method for reducing electric energy consumed by the memory 12 includes the following steps.

Step S401: Set at least two storage areas in the memory 12.

The method for setting the at least two storage areas is similar to the method for setting a dirty data storage area in the first application scenario, and a single difference is that in the second application scenario, multiple storage areas are set, and different types of data are stored in the storage areas.

In this embodiment, three storage areas are set in the memory 12, that is, a written data storage area 41, a read data storage area 42, and a system management data storage area 43, as shown in FIG. 4. The data types herein are merely examples. In another embodiment, more storage areas can be obtained by means of division, and types of data stored in the storage areas can also be set according to actual demands.

Step S402: When a data operation request is received, determine a type of data to be operated in the data operation request.

Step S403: Determine, according to the type of the data to be operated, a storage area corresponding to the data to be operated.

For example, if the data operation request is a data writing request, it is determined that a type of data to be operated in the data writing request is to-be-written data, and it may then be determined that a storage area corresponding to the to-be-written data is a written data storage area. If the data operation request is a request to read data from a hard disk and cache the read data in the memory or a request to read data, it is determined that data to be operated in the data operation request is data to be read, and then it is determined that a storage area corresponding to the data to be read is a read data storage area. Because system operation data generally has a fixed access address, if an address of data to be operated in the operation request is a preset address, it may be determined that the data to be operated is system operation data.

Step S404: Perform, according to the data operation request, a corresponding operation on the data to be operated in the determined data storage area.

Step S405: Set the storage units in another storage area except the determined storage area to a self-refreshing state.

In this way, during operation of a computer device, power is properly supplied only to a storage area that is currently operated in a memory, while ranks in other areas are all in a self-refreshing state, so that power consumption of the memory during normal operation of the computer device is reduced.

Figure 6:
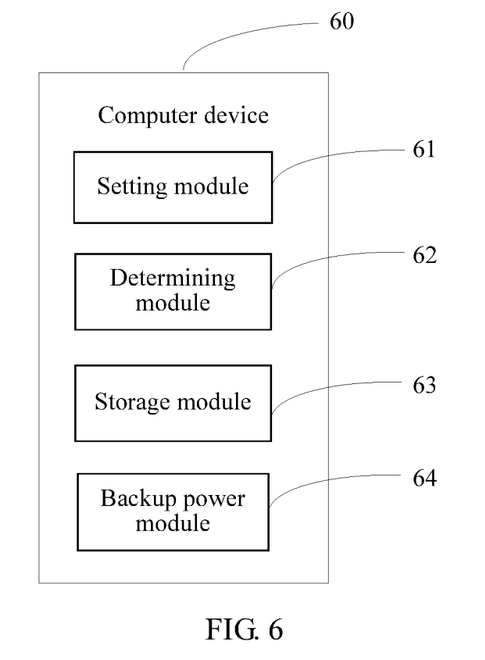
FIG. 6 is a functional block diagram of the computer device in the first application scenario.

As shown in FIG. 6, FIG. 6 is a structural diagram of a computer device 60 that can save electric energy of a backup power supply in the foregoing first application scenario.

The computer device 60 includes a setting module 61, a determining module 62, a storage module 63, and a backup power module 64. The setting module 61 is configured to set a dirty data storage area in the memory. A method for setting dirty data is the same as the method described in FIG. 3, and details are not described herein again.

The determining module 62 is configured to, when a data operation request is received, determine whether data to be operated in the data operation request is dirty data.

The storage module 63 is configured to, when it is determined that the data to be operated in the data operation request is dirty data, store the dirty data in the dirty data storage area.

The backup power module 64 is configured to, after the computer device encounters a power failure, turn on a backup power supply to supply power to the memory; and cause the storage unit included in the dirty data storage area to enter a normal operating state, cause a storage unit outside the dirty data storage area in the memory to enter a self-refreshing state, and write data in the dirty data storage area to a non-volatile storage area.

Figure 7:
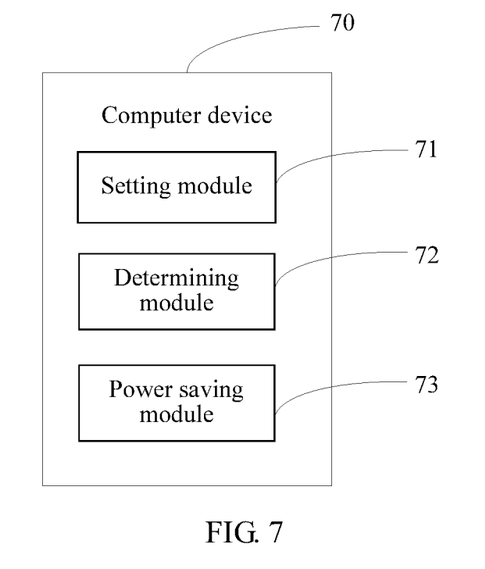
FIG. 7 is a functional block diagram of the computer device in the second application scenario.

As shown in FIG. 7, FIG. 7 is a structural diagram of a computer device 70 that can reduce power consumption of a memory in the foregoing second application scenario.

The computer device 70 includes a setting module 71, a determining module 72, and a power saving module 73. The setting module 71 is configured to set at least two storage areas in the memory.

The determining module 72 is configured to, when a data operation request is received, determine a type of data to be operated in the data operation request, and determine, according to the type of the data to be operated in the data operation request, a storage area corresponding to the data to be operated.

The power saving module 73 is configured to cause the storage area corresponding to the data to be operated to enter an operating state, and cause another storage area in the memory to enter a self-refreshing state.

A person of common skill in the art may understand that all or a part of the steps of the methods in the embodiments may be implemented by a program instructing relevant hardware. The program may be stored in a computer readable storage medium. The storage medium may include a read-only memory (ROM), a RAM, a magnetic disk, or an optical disc.

The method and apparatus for writing a data block provided in the embodiments of the present disclosure are described in detail above. The principle and implementation manners of the present disclosure are described herein using specific examples. The description about the embodiments of the present disclosure is merely provided to help understand the method and core ideas of the present disclosure. In addition, a person of ordinary skill in the art can make variations and modifications to the present disclosure in terms of the specific implementation manners and application scopes according to the ideas of the present disclosure. Therefore, the content of this specification shall not be construed as a limit to the present disclosure.

What is claimed is:

1. A method for reducing power consumption of a memory applied in a computer device, wherein the memory comprises at least two channels, wherein each channel comprises at least two storage units, wherein a dirty data storage area is set in the memory and stores dirty data, wherein the dirty data storage area comprises at least one storage unit in each channel, and wherein the method comprises:
   turning on a backup power supply to supply power to the memory after the computer device encounters a power failure;
   causing the storage unit comprised in the dirty data storage area to keep a normal operating state;

causing a storage unit outside the dirty data storage area in the memory to enter a self-refreshing state;

writing data in the dirty data storage area to a non-volatile storage area of the computer device;

determining whether data in a data operation request comprises dirty data when the data operation request is received; and storing the dirty data in the dirty data storage area when the data in the data operation request comprises the dirty data by:

reading to-be-rewritten data when the data operation request is a data rewriting request and the to-be-rewritten data indicated by the data rewriting request is not stored in the dirty data storage area;

storing the to-be-rewritten data in the dirty data storage area;

rewriting the to-be-rewritten data stored in the dirty data storage area using a writing data comprised in the data rewriting request; and invalidating to-be-rewritten data not stored in the dirty data storage area.

2. The method of claim 1, further comprising receiving setting information of the memory, wherein the setting information of the memory is stored in a basic input/output system (BIOS) memory of the computer device, such that when the computer device is started, the computer device obtains the setting information from the BIOS memory and sets the dirty data storage area.

3. The method of claim 1, wherein writing the data in the dirty data storage area to the non-volatile storage area comprises:

causing a storage unit in the dirty data storage area and currently operated to enter an operating state;

causing a storage unit in the dirty data storage area and not currently operated to enter a self-refreshing state;

causing the storage unit currently operated to enter a self-refreshing state when data in the storage unit currently operated is completely written to a non-volatile memory; and selecting one of storage units that are still not operated as a currently operated storage unit until the data in the dirty data storage area is completely written to the non-volatile memory.

4. A computer device, comprising:
a processor;
a memory controller; and
a memory coupled to the memory controller and the processor and configured to store programming instructions for execution by the processor, wherein the memory comprises at least two channels, wherein each channel comprises two storage units, wherein a dirty data storage area is set in the memory, wherein the dirty data storage area comprises at least one storage unit in each channel, and wherein the programming instructions instruct the processor to:

turn on a backup power supply to supply power to the memory after the computer device encounters a power failure;

cause the storage unit comprised in the dirty data storage area to keep a normal operating state;

cause a storage unit outside the dirty data storage area in the memory to enter a self-refreshing state;

write data in the dirty data storage area to a non-volatile storage area of the computer device, and wherein the memory controller is further instructed to:

determine whether data to he operated in a data operation request comprises dirty data when the data operation request is received and store dirty data in the dirty data storage area when the data to be operated in the data operation request comprises the dirty data by:

reading to-be-rewritten data when the data operation request is a data rewriting request and to-be-rewritten data to he rewritten by the data rewriting request is not stored in the dirty data storage arm storing the to-be-rewritten data in the dirty data storage area;

rewriting, the to-be-rewritten data stored in the dirty data storage area using a writing data comprised in the data rewriting request; and invalidating to-be-rewritten data not stored in the dirty data storage area.

5. The computer device of claim 4, wherein the memory controller is further instructed to receive setting information of the memory, wherein the setting information of the memory is stored in a basic input/output system (BIO) memory of the computer device, such that when the computer device is started, the computer device obtains the setting information from the BIOS memory and sets the dirty data storage area.

6. The computer device of claim 4, wherein writing the data in the dirty data storage area to the non-volatile storage area comprises:

causing a storage unit in the dirty data storage area and currently operated to enter an operating state;

causing a storage unit in the dirty data storage area and not currently operated to enter a self-refreshing state;

causing the storage unit currently operated to enter a self-refreshing state when data in the storage unit currently operated is completely written to a non-volatile memory; and selecting one of storage units that are still not operated as a currently operated storage unit until the data in the dirty data storage area is completely written to the non-volatile memory.

7. The method of claim 1, wherein the storage unit outside of the dirty data storage area comprises common data, and wherein the common data is comprised in the non-volatile storage area of the computer device when the computer device encounters the power failure.

8. The method of claim 1, wherein the storage unit in the dirty data storage area comprises the dirty data, and wherein the dirty data is not comprised in the non-volatile storage area of the computer device when the computer device encounters the power failure.

9. The method of claim 1, wherein the storage unit in the dirty data storage area and the storage unit outside of the dirty data storage area both comprise volatile memory.

10. The method of claim 1, wherein the storage unit in the dirty data storage area and the storage unit outside of the dirty data storage area both comprise banks.

11. The method of claim 1, wherein the storage unit in the dirty data storage area and the storage unit outside of the dirty data storage area both comprise ranks.

12. The method of claim 11, wherein the ranks are comprised in a single Dual-Inline-Memory-Module (DIMM).

13. The method of claim 11, wherein the ranks are comprised in multiple Dual-Inline-Memory-Modules (DIMMs).

14. The computer device of claim 4, wherein the storage unit outside of the dirty data storage area comprises common data, and wherein the common data is comprised in the non-volatile storage area of the computer device when the computer device encounters the power failure.

15. The computer device of claim 4, wherein the storage unit in the dirty data storage area comprises the dirty data, and wherein the dirty data is not comprised in the non-volatile storage area of the computer device when the computer device encounters the power failure.

16. The computer device of claim 4, wherein the storage unit in the dirty data storage area and the storage unit outside of the dirty data storage area both comprise volatile memory.

17. The computer device of claim 4, wherein the storage unit in the dirty data storage area and the storage unit outside of the dirty data storage area both comprise banks.

18. The computer device of claim 4, wherein the storage unit in the dirty data storage area and the storage unit outside of the dirty data storage area both comprise ranks.

19. The computer device of claim 18, wherein the ranks are comprised in a single Dual-Inline-Memory-Module (DIMM).

20. The computer device of claim 18, wherein the ranks are comprised in multiple Dual-Inline-Memory-Modules (DIMMs).

* * * * *

UNITED STATES PATENT AND TRADEMARK OFFICE
CERTIFICATE OF CORRECTION

| | | |
|---|---|---|
| PATENT NO. | : 10,496,303 B2 | Page 1 of 1 |
| APPLICATION NO. | : 15/481602 | |
| DATED | : December 3, 2019 | |
| INVENTOR(S) | : Zhibing Li and Yongjiang Yi | |

It is certified that error appears in the above-identified patent and that said Letters Patent is hereby corrected as shown below:

In the Claims

Claim 4, Column 10, Line 10: "data storage arm" should read "data storage area;"

Signed and Sealed this
Twenty-eighth Day of January, 2020

Andrei Iancu
*Director of the United States Patent and Trademark Office*